United States Patent [19]
Premerlani

[11] Patent Number: 6,148,267
[45] Date of Patent: Nov. 14, 2000

[54] METHOD AND APPARATUS FOR TRANSMISSION LINE PHASE ANGLE COMPARISONS

[75] Inventor: William James Premerlani, Scotia, N.Y.

[73] Assignee: General Electric Company, Schenectady, N.Y.

[21] Appl. No.: 09/002,433

[22] Filed: Jan. 2, 1998

[51] Int. Cl.⁷ ............................. G01R 31/00; G06F 19/00
[52] U.S. Cl. ............................. 702/58; 702/59; 702/185; 324/521
[58] Field of Search ..................... 702/57, 58, 59, 702/64, 65, 72, 69, 123, 112, 183, 184, 185, 193, FOR 103, FOR 104, FOR 106, FOR 111, FOR 156; 324/509, 510, 511, 521, 522, 523, 524; 327/72; 343/905; 361/85, 91.3

[56] References Cited

U.S. PATENT DOCUMENTS

| | | | |
|---|---|---|---|
| 4,408,155 | 10/1983 | McBride | 324/509 |
| 4,408,246 | 10/1983 | Ray | 361/85 |
| 4,715,000 | 12/1987 | Premerlani | 364/484 |
| 5,216,621 | 6/1993 | Dickens | 702/58 |
| 5,455,776 | 10/1995 | Novosel | 324/509 |
| 5,506,789 | 4/1996 | Russell et al. | 702/58 |
| 5,514,978 | 5/1996 | Koegl et al. | 324/772 |
| 5,786,708 | 7/1998 | Premerlani et al. | 324/772 |
| 5,809,045 | 9/1998 | Adamiak et al. | 714/799 |

FOREIGN PATENT DOCUMENTS 9612969   5/1996   WIPO .

OTHER PUBLICATIONS

"Internet Time Synchronization: The Network Time Protocol" By DL Mills, IEEE Trans on Communications, vol. 39, No. 10, Oct. 1991.

US Patent Application "Self–Tuning and Compensating Turn Fault Detector" By Premerlani, et al, Ser. No. 08/494,865 Filed Aug. 24, 1995, Attorney Docket RD–24,585.

"Charge Comparison Protection of Transmission Lines—Relaying Concepts" by Leonard J. Ernst, et al, 1992 IEEE, 92 WM. 209–7 PWRD, pp. 1–9.

"Charge Comparison Protection of Transmission Lines—Communications Concepts" By Norman P. Albrecht, et al, 1992 IEEE, 92 WM 210–5 PWRD, pp. 1–7.

"High Speed Phase Segregated Line Differential Relay" By H. Peterson, ABB Inc., Canada, Paper #102, Mar. 1995 Vancouver, B.C. pp. 1–10.

"Type HCD PCM Current Differential Carrier Relay Scheme" By Mitshubishi Electric Corp., 15 pages.

"Digital Current Differential Relay Type D2L7E" By Toshiba, pp. 1–11.

"Synchronized Phasor Measurements In Power System" By AG Phadke, IEEE Computer Applications In Power, Apr. 1993, pp. 10–15.

"Computer Relaying for Power Systems" By Arun Phadke, et al, 1988, Chap 3.6, Discrete Fourier Transform–pp 85–88; Chap 4.3 Relaying as Parameter Estimation–pp 123–129; Chap 5.2 Power Transformer Algorithms–pp 166–176; Chap 8.9 Adaptive Relaying pp 260–263.

*Primary Examiner*—Marc S. Hoff
*Assistant Examiner*—Manuel L. Barbee
*Attorney, Agent, or Firm*—Ann M. Agosti; Jill M. Breedlove

[57] ABSTRACT

A method for internal fault detection comprises determining whether a local current on a local transmission line terminal exceeds a variable first fault level threshold; if so, determining whether a remote current on a remote transmission line terminal exceeds a variable second fault level threshold; and if so, comparing phases of the local and remote currents. The method can include determining local and remote uncertainty factors for the local and remote currents and using the uncertainty factors to adjust the variable thresholds. The method can further include measuring a current on a local transmission line terminal and bandpass filtering the measured current to obtain the local current.

11 Claims, 3 Drawing Sheets

METHOD AND APPARATUS FOR TRANSMISSION LINE PHASE ANGLE COMPARISONS

BACKGROUND OF THE INVENTION

The present invention relates to detection of internal faults on power system transmission lines by phase angle comparisons at ends of the transmission lines. Phase comparison relaying is a type of differential relaying that compares the phase angles of the currents entering one terminal of a transmission line with the phase angles of the currents entering all the remote terminals of the same line. For internal faults, the currents entering all the terminals will be in phase, and for conditions of an external or through fault, or for normal load flow, the currents entering any one terminal will be 180 degrees out of phase with the currents entering at least one of the remote terminals. The phase comparison relay scheme makes this phase angle comparison and trips the associated breakers for internal faults. Because terminals of a transmission line are normally many miles apart, a communication channel is needed between the terminals to make this comparison.

To compare each of three phase currents individually, separate communication channels would be required. To reduce the number of required channels to one, all three phase currents can be mixed to produce a single phase quantity whose magnitude and phase angle represent the magnitude and phase angle of the three original currents. This mixed single phase quantity can be compared with a similarly obtained quantity at the remote end or ends of the line.

In many techniques, fault detectors are provided to initiate phase comparisons only when a fault occurs on or in the general vicinity of the protected line. In conventional phase comparison methods, phase angle information is exchanged between ends of a transmission line in the form of a two level (Boolean) signal or three level signal that changes level when a monitored current crosses a certain threshold (a fault occurs). The level of a two level channel is changed whenever the current crosses a single threshold. For a three level channel, the channel level is controlled by the current level which may be within one of three ranges. Conventional phase comparison methods generally have sensitivity and security limitations because current measurements are subject to uncertainty.

In one technique, a microprocessor at each terminal compares the coincident time of a positive half cycle of mixed single phase current from its terminal when a fault is present (when the current exceeds a high fault detection threshold FDH) with an absence of an output signal from its receiver. If a fault occurs at a terminal and the receiver does not produce an output signal for a specified period of time, during the positive half cycle of single phase mixed current, a trip output signal will be obtained.

Whether the receiver provides an output signal depends on the keying of the remote transmitter. Remote transmitters are keyed ON by a signal from a FDL (low fault detection threshold) comparison if the current exceeds FDL and keyed OFF if FDL is not exceeded and/or if positive half cycles of current are occurring. Thus a blocking signal is initiated by an associated transmitter and sent to a remote receiver to produce an output signal to block tripping during external faults during the negative half cycle when the mixed single phase current exceeds the low fault detection threshold.

For an internal fault, the currents entering both ends of the line are in phase. Thus, during the half cycle that a remote mixing network is providing a positive current and the receiver at a local transmitter is producing no output signal, tripping will take place a both ends of the line if FDH is exceeded at the local transmitter. For an external fault, the current entering one terminal is 180 degrees out of phase with the current entering the other terminal. During the half cycles when the remote mixer is providing a positive current and FDH is exceeded (so that the associated receiver at the local transmitter is providing an output signal), no tripping will take place.

SUMMARY OF THE INVENTION

It would be desirable to detect internal faults on power system transmission lines by comparing phase angles of currents at the ends of the transmission lines by transmitting phase angle information over a simple, low bandwidth channel. It would be particularly advantageous for utility companies to be able to modify existing analog phase comparison methods to use digital technology while maintaining the existing analog communications channels. In a hybrid approach, calculations at terminals are performed digitally with existing analog communications channels being used to exchange phase angle information.

In the present invention, improved sensitivity and security are achieved by using an adaptive statistical technique in which statistical parameters continually adjust the sensitivity of the method by adjusting the level thresholds (FDH and FDL) to match the certainty of the measurements. During transient system disturbances, the statistical parameters desensitize the method for a few milliseconds. Thus sensitivity is increased during steady state performance conditions and security is enhanced (while sensitivity is correspondingly decreased) during transient disturbances. In one embodiment, a bandpass filter can be used to improve the process for obtaining a remote keying signal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
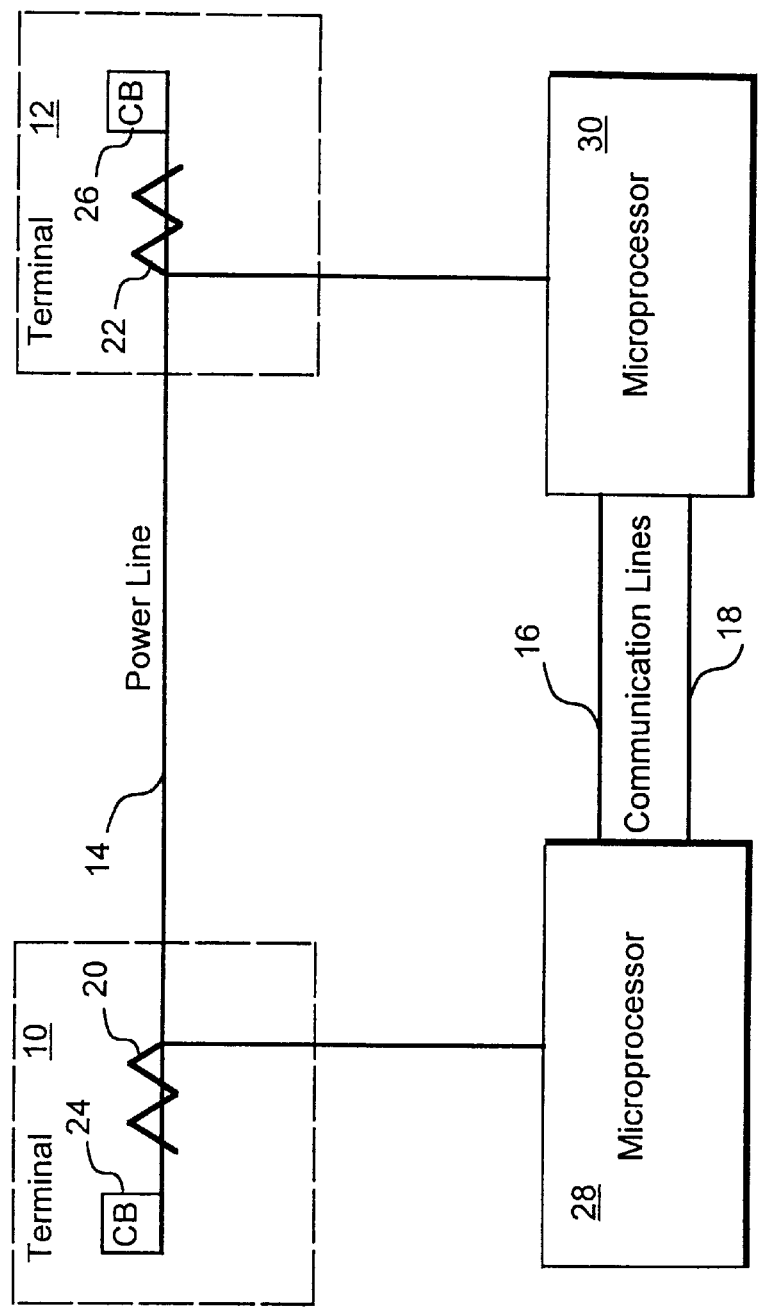
FIG. 1 is a circuit diagram of a transmission line and communication lines between two terminals.

FIG. 1 is a curcuit diagram of a transmission line 14 and communication lines 16 and 18 between two terminals 10 and 12. The terminals have respective curcuit breakers 24 and 26 and current sensors 20 and 22 that supply three phase current data to microprocessors 28 and 30. Although one current sensor is shown for each terminal, in practice three current sensors will be used with each corresponding to a respective phase current. The microprocessors include analog-to-digital converters and digital analog converters (not shown). Although redundant communication lines are preferred they are not required.

Figure 2A:
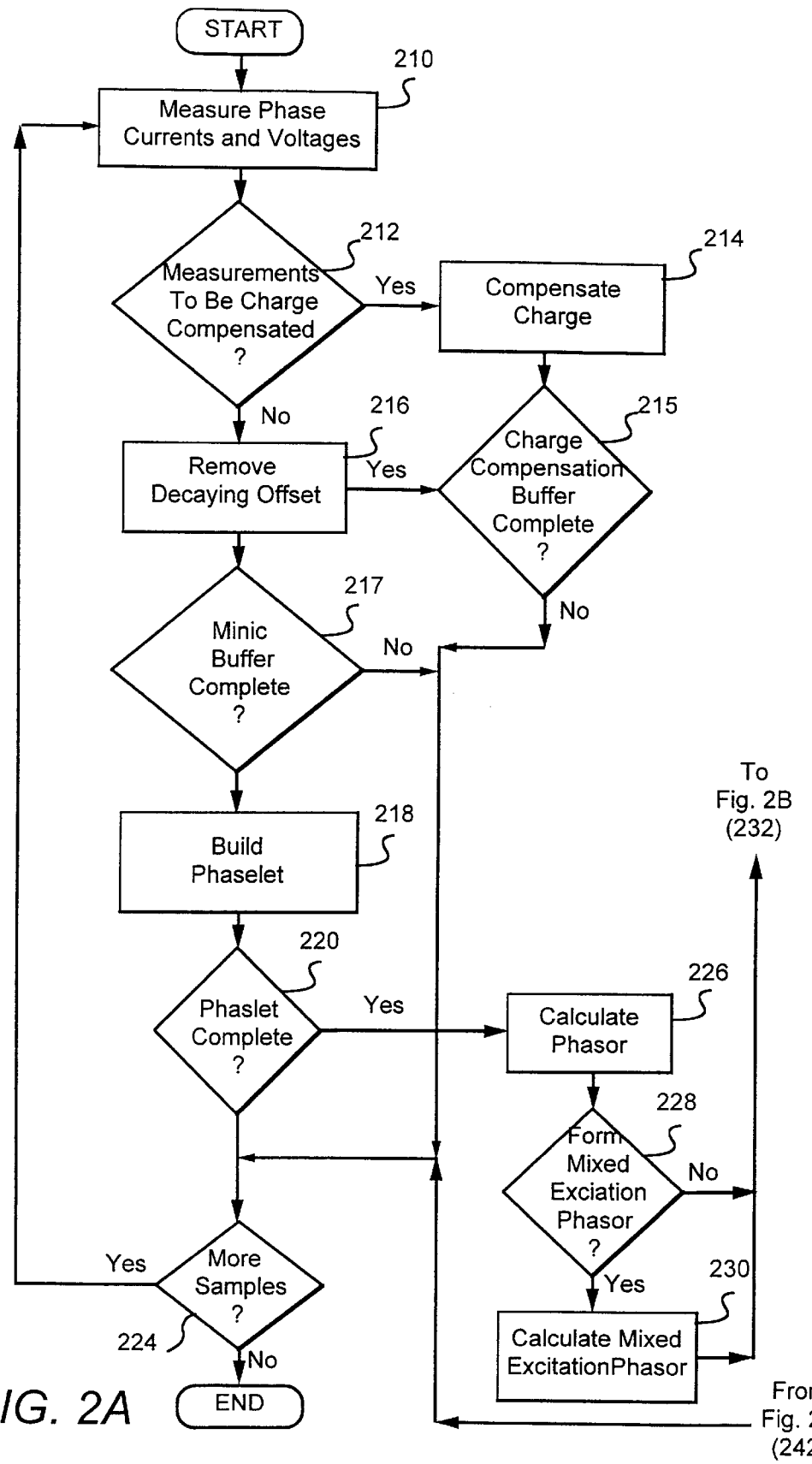
FIGS. 2A and 2B are a flow chart of a phase comparison method of the present invention.
Figure 2B:
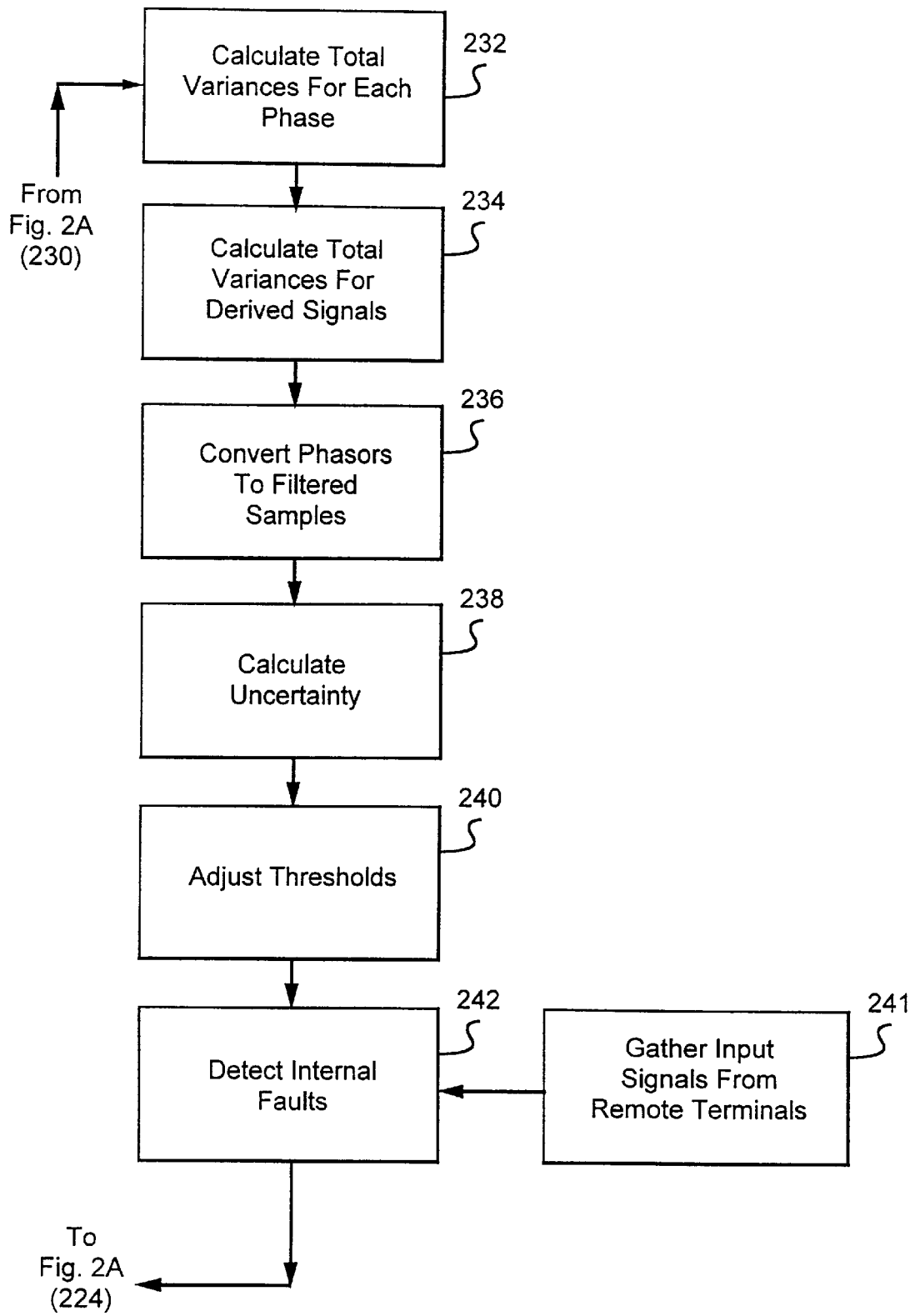

FIGS. 2A and 2B are a top level flow chart for a hybrid phase comparison technique to be executed by the microprocessors. The main loop is driven by repeated calls to measure phase currents and voltages of a local terminal. The flow chart of FIGS. 2A and 2B is repeated by the local and each remote terminal. Each terminal then sends an output signal along the communications lines 16 and 18 to each other terminal and evaluates its respective data in light of the input signals its receiver obtains from the other terminals.

At step 210, phase currents and voltages are measured and stored.

At step 212 it is determined whether charge compensation of the measured currents will be performed. If the charge will be compensated, the charge compensation occurs at step 214. In one embodiment, the first step of charge compensation is using the measured voltages to calculate the zero sequence voltage.

As described in commonly assigned Koegl et al., U.S. Pat. No. 5,514,978, the following equation represents computation of the fundamental component of a phasor from data samples:

$$X(m) = \frac{2}{N} \sum_{k=m-N}^{m-1} x(k\Delta t) e^{-j2k\frac{\pi}{N}}, \quad (1)$$

where X(m) is the estimate of the phasor value of a cycle's worth of samples X (which can represent current I or voltage V), at sample m (real time), with N samples taken per cycle, and where k is the summation index (an integer). For three phase analysis, the process is repeated for each phase:

$$X_a(m) = \frac{2}{N} \sum_{k=m-N}^{m-1} x_a(k\Delta t) e^{-j2k\frac{\pi}{N}} \quad (2)$$

$$X_b(m) = \frac{2}{N} \sum_{k=m-N}^{m-1} x_b(k\Delta t) e^{-j2k\frac{\pi}{N}} \quad (3)$$

$$X_c(m) = \frac{2}{N} \sum_{k=m-N}^{m-1} x_c(k\Delta t) e^{-j2k\frac{\pi}{N}}. \quad (4)$$

Symmetrical components are calculated from the phase components as follows:

$$X_0 = \frac{1}{3}(X_a + X_b + X_c) \quad (5)$$

$$X_+ = \frac{1}{3}(X_a + aX_b + a^2 X_c) \quad (6)$$

$$X_- = \frac{1}{3}(X_a + a^2 X_b + aX_c), \quad (7)$$

wherein "a" is a phasor of unit magnitude and an angle of 120 degrees ($e^{j2\pi/3}$), $X_0$ is the zero sequence phasor, $X_+$ is the positive sequence phasor, and $X_-$ is the negative sequence phasor.

Next the compensated V (the zero sequence voltage) can be divided by a predetermined charging reactance value X for each phase to provide a compensation current, and, at step 215 it is determined whether the charge compensation buffer is complete. This determination can be made by using a counter to determine whether a predetermined number of values has been stored.

If the charge compensation buffer is complete, the charge compensation can be performed with the contribution of charging currents (the compensation currents) being removed by subtraction.

For short transmission lines, the charging current can be treated as an unknown error. In these embodiments, no voltage sensors are needed, and line charging current is included as a constant term in the total variance.

For long transmission lines, the charging current can become significant and compromise sensitivity, so charging current compensation using voltage measurements is beneficial. In one embodiment, the compensation current discussed above is the subtracted term. Charge compensation techniques are further discussed in commonly assigned Adamiak et al., U.S. Pat. No. 5,809,045 for example. After charge compensating the currents, the change compensated currents can then be stored.

If the charge compensation buffer is incomplete, at step 215, the flow chart moves to step 224 to determine whether more samples are to be measured (that is, whether the transmission line is still in operation) before returning to step 210 for measurement of additional phase currents and voltages. It is anticipated that as long as the transmission line is operational, the collection of samples and determination of internal faults will continue.

If no charge compensation is performed, or, if charge compensation is performed, after charge compensation is complete, at step 216 decaying offset is removed from the currents (the phase currents if no charge compensation was performed or the compensated currents if charge compensation was performed). In one embodiment, a mimic algorithm is used. First it is determined whether the mimic buffer is complete. If the mimic buffer is complete, a mimic calculation is performed to remove any decaying offsets and the resulting mimic currents are stored in the buffer.

As discussed in Adamiak et al., a the following mimic algorithm can be used to remove decaying offsets:

$$Imimic_m = \frac{R}{\cos\left(\frac{\pi \cdot M}{N}\right)} \cdot \frac{(i_m + i_{m-M})}{2} + \frac{X}{\sin\left(\frac{\pi \cdot M}{N}\right)} \cdot \frac{(i_m - i_{m-M})}{2}, \quad (8)$$

wherein
$Imimic_m$=mth sample of the output of the mimic algorithm,
$i_m$=mth current sample,
m=sample index, starting from 1, at N samples per cycle,
M=interval, in samples, used to approximate the mimic simulation,
N=sampling rate, samples per cycle,
X=reactance of the mimic,
R=resistance of the mimic.

A similar equation can be used for voltage samples. Transient response of the mimic is M samples, at N samples per cycle. Using M=4 and N=64, transient response is 1 millisecond. The current samples which have been passed through the mimic algorithm are the current samples which are then used in the phaselet and phasor calculations discussed with respect to steps 218, 220, and 226.

If the mimic buffer is incomplete, the mimic steps to remove decaying offset are not performed. Instead, at step 217, the flow chart moves to step 224, as discussed above with respect to the charge compensation buffer determination.

In a preferred embodiment, after the mimic calculations are performed, phaselets are built at step 218 for each phase of measured current. First, it is determined whether a current phaselet term is the first term of a phaselet. If so, the first term of the phaselet is calculated and the sum of the squares is calculated. If not, the next term of the phaselet is calculated and the square for that term is calculated and added to a running total of a sum of the squares.

As described in Adamiak et al., a phaselet can be calculated as follows:

$$PhaseletReal_p = \sum_{m=p \cdot P - P + 1}^{p \cdot P} \cos\left(\frac{2 \cdot \pi}{N} \cdot \left(m - \frac{1}{2}\right)\right) \cdot Imimic_m, \text{ and} \quad (9)$$

$$PhaseletImaginary_p = \sum_{m=p \cdot P - P + 1}^{p \cdot P} -\sin\left(\frac{2 \cdot \pi}{N} \cdot \left(m - \frac{1}{2}\right)\right) \cdot Imimic_m, \quad (10)$$

wherein $PhaseletReal_p$=the real part of the pth phaselet for signal x, $PhaseletImaginary_p$=the imaginary part of the pth phaselet for x, p=phaselet index; there are N/P phaselets per cycle, P=number of samples per phaselet, N=number of samples per cycle, m=sample index $Imimic_m$=mth sample of the output of the mimic algorithm. As described in Adamiak et al., the sum of the squares of individual samples can be calculated as follows:

$$PartialSumOfSquares_p = \sum_{m=p \cdot P - P + 1}^{p \cdot P} Imimic_m^2. \quad (11)$$

Once m (the sample index) is equal to the phaselet index times the number of samples per cycle, the phaselet is complete. The value of m can be incremented each time step 218 is performed. At step 220 it is determined whether the phaselet is complete. If the phaselet is not complete, at step 224 it is determined whether there are more samples to measure. If the phaselet is complete, a phasor computation is executed at step 226. First, it is determined whether the window of phaselets is a full size window.

If the window is full size, old phaselet information is retrieved from a history buffer, and new phaselet information is saved in the history buffer. Then, as discussed in aforementioned Adamiak et al., the newest of the phaselet information is added to a sum of the phaselets for the window and the oldest of the phaselets is subtracted from the sum of the phaselets for the window to obtain a phasor.

In the event that the window is not a full window, the new phaselet information is stored in the history buffer, and the phaselets for each phase are added to a sums of previously summed phaselets for each phase in the window and the sums of squares are also added to running totals for each phase. Each sum of phaselets is transformed into a phasor.

As described in Adamiak et al. sums can be transformed into phasors by multiplying by the following matrix:

$$\begin{bmatrix} PhasorReal_n \\ PhasorImaginary_n \end{bmatrix} = \quad (12)$$

$$\begin{bmatrix} T_{RR}(n, W) & T_{RI}(n, W) \\ T_{IR}(n, W) & T_{II}(n, W) \end{bmatrix} \cdot \begin{bmatrix} PhaseletSumReal_n \\ PhaseletSumImaginary_n \end{bmatrix}$$

wherein $$T_{RR} = \left(1 - \left(\frac{1}{W} \cdot \cos\left(\frac{4 \cdot \pi \cdot P \cdot n}{N} - \frac{2 \cdot \pi \cdot W}{N}\right) \cdot \frac{\sin\left(\frac{2 \cdot \pi \cdot W}{N}\right)}{\sin\left(\frac{2 \cdot \pi}{N}\right)}\right)\right) \cdot \quad (13)$$

$$\frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}}$$

$$T_{RI} = T_{IR} = \frac{1}{W} \cdot \sin\left(\frac{4 \cdot \pi \cdot P \cdot n}{N} - \frac{2 \cdot \pi \cdot W}{N}\right) \cdot \quad (14)$$

$$\frac{\sin\left(\frac{2 \cdot \pi \cdot W}{N}\right)}{\sin\left(\frac{2 \cdot \pi}{N}\right)} \cdot \frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}}$$

$$T_{II} = \left(1 + \left(\frac{1}{W} \cdot \cos\left(\frac{4 \cdot \pi \cdot P \cdot n}{N} - \frac{2 \cdot \pi \cdot W}{N}\right) \cdot \frac{\sin\left(\frac{2 \cdot \pi \cdot W}{N}\right)}{\sin\left(\frac{2 \cdot \pi}{N}\right)}\right)\right) \cdot \quad (15)$$

$$\frac{2}{W - \frac{\left(\sin\left(\frac{2 \cdot \pi \cdot W}{N}\right)\right)^2}{W \cdot \left(\sin\left(\frac{2 \cdot \pi}{N}\right)\right)^2}}$$

wherein n represents the phasor index, W=window size in samples, and W/P is window size in phaselets. The matrix thus depends on design constants P and N and variables W and n. In principle, a matrix should be calculated for each combination of n and W. As also described in aforementioned Adamiak et al., the phasors can be calculated from the phaselets using a disturbance detector to control the width of the window. Although phaselets are not required for the present invention and the bandpass filtering can be performed in any desired manner, phaselets are particularly useful for embodiments where the window is not a full or fixed size window or where window size is adjusted for disturbances.

When designing a digital-analog hybrid phase comparison system, decisions must be made regarding the information to be transmitted over the analog channel with communication lines 16 and 18 and the phase comparison method. Transmitting information by using phasors to perform keying (producing the two or three level signals) is a departure from a purely analog implementation but can be an opportunity to provide improved performance. In the present invention, a phasor computation is used as a band pass filter that passes fundamental power system frequency components. Keying is performed in steps 238 and 240 after converting phasors into instantaneous values.

The phase comparison method can be performed by any of a number of conventional phase comparison techniques. In one embodiment, a simple, dual polarity, two terminal system is used. A hybrid system will work properly if the translation between digital and analog representations is performed in a consistent manner. In one embodiment, equations are used in three areas where some of the coefficients of a discrete Fourier transform (DFT) are used. Phasor values can be calculated from measured data samples over a full cycle window as described above with respect to equation (1).

At step 228 it is determined whether a mixed excitation phasor will be formed, and, if so, at step 230 an excitation phasor will be calculated prior to variance calculations at step 232. At step 230, sequence currents and a mixed excitation phasor are calculated from separate phasors from each phase. This step is preferred but not required. The present invention is applicable to either a three analog channel or a mixed single analog channel embodiment. If a single analog channel is used, a mixed excitation scheme can be used to combine three phase information as discussed above. A recommended mixed excitation scheme to obtained a mixed signal $I_{mixed}$ is:

$$I_{mixed} = I2 + K*I1 \text{ or } I2 - K*I1, \tag{16}$$

wherein I1 represents a positive sequence current, I2 represents a negative sequence current, and K represents a constant which can be selected by conventional techniques and, in one embodiment, is 0.05, for example. Other mixed signals can be used however. For example, $I_{mixed}$ could be set to equal I1 or I2.

At step 232, a total variance for each phase is calculated. As described in Adamiak et al., a covariance matrix can be calculated as follows for each phase.

$$\begin{bmatrix} C_{RR(n,W)} & C_{RI(n,W)} \\ C_{IR(n,W)} & C_{II(n,W)} \end{bmatrix} = \tag{17}$$

$$\sigma_n^2 \cdot \left( \begin{bmatrix} T_{RR(n,W)} & T_{RI(n,W)} \\ T_{IR(n,W)} & T_{II(n,W)} \end{bmatrix} \right) = \frac{E_n^2}{W} \cdot \left( \begin{bmatrix} T_{RR(n,W)} & T_{RI(n,W)} \\ T_{IR(n,W)} & T_{II(n,W)} \end{bmatrix} \right)$$

wherein $T_{RR(n,W)}$, $T_{RI(n,W)}$, $T_{IR(n,W)}$, & $T_{II(n,W)}$ are defined by equations 13–15, $C_{RR}$=expected value of square of error in real part of a phasor, $C_{RI}=C_{IR}$=expected value of product of errors in the real & imaginary, parts, $C_{II}$=expected value of square of error in imaginary part of a phasor.

$E_n^2$=sum of squares of the errors.

The covariance matrix for a respective phase (VAR$_{An}$, VAR$_{Bn}$, VAR$_{Cn}$) can then be used to determine the variance for that respective phase as follows:

$$VAR_{An} = CRR_{An} \cdot \left[\cos\frac{2\cdot\pi}{N}\cdot\left(n-\frac{1}{2}\right)\right]^2 + CII_{An}\cdot\left[\sin\frac{2\cdot\pi}{N}\cdot\left(n-\frac{1}{2}\right)\right]^2 - \tag{18}$$
$$2\cdot CRI_{An}\cdot\left[\sin\frac{2\cdot\pi}{N}\cdot\left(n-\frac{1}{2}\right)\right]\cdot\left[\cos\frac{2\cdot\pi}{N}\cdot\left(n-\frac{1}{2}\right)\right]$$

$$VAR_{Bn} = CRR_{Bn} \cdot \left[\cos\frac{2\cdot\pi}{N}\cdot\left(n-\frac{1}{2}\right)\right]^2 + CII_{Bn}\cdot\left[\sin\frac{2\cdot\pi}{N}\cdot\left(n-\frac{1}{2}\right)\right]^2 - \tag{19}$$
$$2\cdot CRI_{Bn}\cdot\left[\sin\frac{2\cdot\pi}{N}\cdot\left(n-\frac{1}{2}\right)\right]\cdot\left[\cos\frac{2\cdot\pi}{N}\cdot\left(n-\frac{1}{2}\right)\right]$$

$$VAR_{Cn} = CRR_{Cn} \cdot \left[\cos\frac{2\cdot\pi}{N}\cdot\left(n-\frac{1}{2}\right)\right]^2 + CII_{Cn}\cdot\left[\sin\frac{2\cdot\pi}{N}\cdot\left(n-\frac{1}{2}\right)\right]^2 - \tag{20}$$
$$2\cdot CRI_{Cn}\cdot\left[\sin\frac{2\cdot\pi}{N}\cdot\left(n-\frac{1}{2}\right)\right]\cdot\left[\cos\frac{2\cdot\pi}{N}\cdot\left(n-\frac{1}{2}\right)\right]$$

The variances in turn can be used to determine corresponding standard deviations $\sigma_{An}, \sigma_{Bn}, \sigma_{Cn}$ as follows:

$$\sigma_{A_n} = \sqrt{VAR_{A_n}} \tag{21}$$

$$\sigma_{B_n} = \sqrt{VAR_{B_n}} \tag{22}$$

$$\sigma_{C_n} = \sqrt{VAR_{C_n}}. \tag{23}$$

At step 234, the total variances for the derived signals are calculated from phaselet information.

In an embodiment wherein $I_{mixed}$ comprises a positive or negative sequence current, a mixed variance which is equal to the sequence variance can be converted from phase variance as follows:

$$VAR_{mixed} = \left[\frac{VAR_a + VAR_b + VAR_c}{9}\right]. \tag{24}$$

In a mixed signal embodiment wherein $I_{mixed}=I_2\pm K\cdot I_1$, a mixed variance can be calculated from phase variance as follows:

$$VAR_{mixed} = [1 + K^2]\cdot\left[\frac{VAR_a + VAR_b + VAR_c}{9}\right] \pm \tag{25}$$
$$K\cdot\left[\frac{2\cdot VAR_a - VAR_b - VAR_c}{9}\right]$$

The variance equation underscores the asymmetry introduced by combining positive and negative sequence quantities. If the variance is the same for each phase, the net variance is $(1+K*K)/3$ times the variance. If, however, the variance is not the same for each phase, the net variance will depend on how the variance is distributed over the phases. The variance, like the transients, will thus depend on which phase has a fault.

For simplicity, equation (25) is written in the form of a single quadrant. In practice, an array of VAR$_{mixed}$ values (VAR$_{mixedRR}$, VAR$_{mixedII}$, VAR$_{mixedRI}$, and VAR$_{mixedIR}$) will be formed and can be positioned in a transformation matrix to replace the transformation array of equation 17.

At step 236 the phasors are converted back to filtered samples. The following equation can be used for full size windows to calculate the instantaneous value $i_{local}$ at time step n that corresponds to a phasor $I_{mixed}$:

$$i_{local} = real\left(e^{j\frac{2\cdot\pi}{N}\left(n-\frac{1}{2}\right)} \cdot I_{mixed}\right). \tag{26}$$

The resulting analog output stream of the above equation will have the same phase angle as the fundamental frequency component used to calculate the phasor.

Equation (26) can be rewritten in terms of real and imaginary components of the phasor as follows:

$$i_{local} = \tag{27}$$
$$realI_{mixed}\cdot\cos\left[\frac{2\cdot\pi}{N}\cdot\left(n-\frac{1}{2}\right)\right] - imagI_{mixed}\cdot\sin\left[\frac{2\cdot\pi}{N}\cdot\left(n-\frac{1}{2}\right)\right].$$

wherein realI$_{mixed}$ represents the real component and imagI$_{mixed}$ represents the imaginary component of the phasor.

At step 238, an uncertainty $\sigma_{mixed}$ is calculated for each signal using the mixed variance obtained in equation (24) or (25):

$$\sigma_{mixed} = \sqrt{VAR_{mixed}}. \qquad (28)$$

At step 240, thresholding and coincidence logic are applied by adding the uncertainty to FDH and FDL thresholds.

As discussed above, for improved security, phase comparison techniques often use keying where both the local and the received (transmitted from remote) signals $i_{local}(t)$ and $i_{remote}(t)$ are compared with a pickup threshold before computing coincidence:

$$|i_{local}(t)| > FDH \qquad (29)$$

$$|i_{remote}(t)| > FDL \qquad (30)$$

wherein t=time

FDH=high fault detection threshold

FDL=low fault detection threshold.

Because of the uncertainty in the local and remote signals, changes in current sign are difficult to detect with certainty. Furthermore, FDH and FDL have a desensitizing effect. As they increase, the region of detectable conditions is reduced. By making FDH and FDL adaptive quantities according to the present invention, it is possible to increase sensitivity without sacrificing security by extending the keying to consider the uncertainty implied by the following covariance matrix:

$$|i_{local}(t)| > FDH + b \cdot \sigma_{mixedlocal} \qquad (31)$$

$$|i_{remote}(t)| > FDL + b \cdot \sigma_{mixed\,remote} \qquad (32)$$

wherein b is a multiplier that can be used to control the trade off between sensitivity and security, and $\sigma_{mixedlocal}$ and $\sigma_{mixedremote}$ are the uncertainty factor calculated at step 736. FDH and FDL can be set by conventional techniques. By setting b equal to zero, the behavior of conventional keying schemes is obtained. By increasing the value of b, security is improved at the expense of reduced sensitivity during transients. A recommended range of b is from about 1 to about 2.

Equations (31 and 32) will be performed at each terminal with the $i_{local}(t)$ and $i_{remote}(t)$ both having the value of the filtered current sample $i_{local}$ from equations (26 and 27) at the respective terminal and $\sigma_{mixedlocal}$ and $\sigma_{mixedremote}$ having the $\sigma_{mixed}$ value calculated in equation (28).

Thus, the present invention provides an efficient manner for filtering the current samples and provides adaptive thresholds which increase comparison sensitivity without sacrificing security. Although in a preferred embodiment, both the filtering and adaptive thresholding techniques are used, either technique can be used individually if desired.

Equation (31) will then be used by the respective local terminal in conjunction with one or more input signals received from the remote terminals. The local terminal will send the result of equation (32) to each of the one or more remote terminals.

At step 241, the remote terminals send the results of their equation (32) type analysis to the local terminal.

At step 242 any internal faults are detected. As discussed in the background section above, internal faults on power system transmission lines are detected by phase angle comparisons at ends of the transmission lines to determine whether the currents entering all the terminals are in phase (an internal fault) which are made only when a fault occurs on or in the general vicinity of the protected line. That is, only when equation (31) is true for a local terminal and a receiver output signal at that terminal is not present due to either equation (32) not being true or the presence of positive half cycle of mixed single phase current at the respective remote terminal. If a fault occurs at a terminal and the receiver output signal is not present for a specified period of time during the positive half cycle of single phase mixed current, a trip output will be obtained.

If no internal faults are detected at the local terminal, it is determined at step 224 whether more samples should be obtained for comparison (that is, whether the transmission line is still in operation) before returning to step 210 for measurement of additional phase currents and voltages.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for transmission line phase angle comparisons for internal fault detection comprising:

determining whether a local current on a local transmission line terminal exceeds a variable first fault level threshold by computing a local uncertainty factor for the local current and using the local uncertainty factor to adjust the variable first fault level threshold;

determining whether a remote current on a remote transmission line terminal exceeds a variable second fault level threshold by computing a remote uncertainty factor for the remote current and using the remote uncertainty factor to adjust the variable second fault level threshold; and if the local current on the local transmission line terminal exceeds the variable first fault level threshold and the remote current on the remote transmission line terminal exceeds the variable second fault level threshold, comparing phases of the local and remote currents.

2. The method of claim 1 wherein the local transmission line terminal has three phase currents, wherein the local current comprises one of the three phase currents, and wherein computing the local uncertainty factor for the local current includes determining a variance for each of the three phase currents.

3. The method of claim 2 wherein computing the local uncertainty factor further includes combining the three variances into a single mixed variance.

4. The method of claim 3 wherein determining whether a local current on a local transmission line terminal exceeds a variable first fault level threshold further includes multiplying the local uncertainty factor by a predetermined multiplier and adding the result to a predetermined base threshold to obtain a value of the variable first fault level threshold.

5. The method of claim 1 further including obtaining the local current by measuring a phase current on the local transmission line terminal and bandpass filtering the measured phase current.

6. The method of claim 5 wherein bandpass filtering comprises transforming the measured current to a phasor and re-transforming the phasor to obtain the local current.

7. An apparatus for transmission line phase angle comparisons for internal fault detection comprising:

a current sensor for sensing a local current on a local transmission line terminal; and a computer for determining whether the local current exceeds a variable first fault level threshold by computing a local uncertainty factor for the local current and using the local uncertainty factor to adjust the variable first fault level threshold, determining whether a remote current on a remote transmission line terminal exceeds a variable second fault level threshold by computing a remote uncertainty factor for the remote current and using the remote uncertainty factor to adjust the variable second fault level threshold; and if the local current on the local transmission line terminal exceeds the variable first fault level threshold and the remote current on the remote transmission line terminal exceeds the variable second fault level threshold, comparing phases of the local and remote currents.

8. The apparatus of claim 7 wherein the local transmission line terminal has three phase currents, wherein the local current comprises one of the three phase currents, and wherein the computer is adapted to compute the local uncertainty factor for the local current by determining a variance for each of the three phase currents.

9. The apparatus of claim 8 wherein the computer is further adapted to compute the local uncertainty factor by combining the three variances into a single mixed variance.

10. The apparatus of claim 9 wherein the computer is further adapted to determine whether a local current on a local transmission line terminal exceeds a variable first fault level threshold by multiplying the local uncertainty factor by a predetermined multiplier and adding the result to a predetermined base threshold to obtain a value of the variable first fault level threshold.

11. The apparatus of claim 11 further including a bandpass filter for filtering the local current and wherein the computer is adapted to use the filtered local current for determining whether the local current exceeds the variable first fault level threshold and comparing the phases of the local and remote currents.

* * * * *